United States Patent [19]
Muto

[11] Patent Number: 5,146,223
[45] Date of Patent: Sep. 8, 1992

[54] ANALOG-TO-DIGITAL CONVERTER CIRCUIT

[75] Inventor: Hiroyasu Muto, Tokyo, Japan
[73] Assignee: NEC Corporation, Tokyo, Japan
[21] Appl. No.: 786,540
[22] Filed: Nov. 1, 1991
[30] Foreign Application Priority Data
    Nov. 2, 1990 [JP] Japan ............... 2-297620
[51] Int. Cl.⁵ .................. H03M 1/06; H03M 1/12
[52] U.S. Cl. .................... 341/118; 341/155
[58] Field of Search .............. 341/118, 155, 120
[56] References Cited
    U.S. PATENT DOCUMENTS
    4,228,423  10/1980  Schwerdt .
    4,229,703  10/1980  Bustin .
    4,251,803   2/1981  Debord et al. .
    4,380,005   4/1983  Debord et al. .
    4,498,072   2/1985  Moriyama .
    4,590,458   5/1986  Evans et al. .
    4,766,417   8/1988  Takayama et al. .............. 341/118
    4,771,267   9/1988  Russel, Jr. et al. ............ 341/118

Primary Examiner—Sharon D. Logan
Attorney, Agent, or Firm—Sughrue, Mion, Zinn, Macpeack & Seas

[57] ABSTRACT

The offset from the ideal value for the bias voltage to be added to the input signal to the A/D converter and the offset from the ideal value of the average voltage in the analog signal are detected. The detected offset is substracted from the output data of the A/D converter. Alternately, the bias voltage may be changed by the detected offset so that the average voltage of the input signal to the A/D converter is equal to the ideal value.

8 Claims, 6 Drawing Sheets

ANALOG-TO-DIGITAL CONVERTER CIRCUIT

BACKGROUND OF THE INVENTION

The present invention relates to an analog-to-digital (A/D) converter circuit, more specifically to an A/D converter circuit capable of removing an offset in an input an analog signal.

Figure 9:
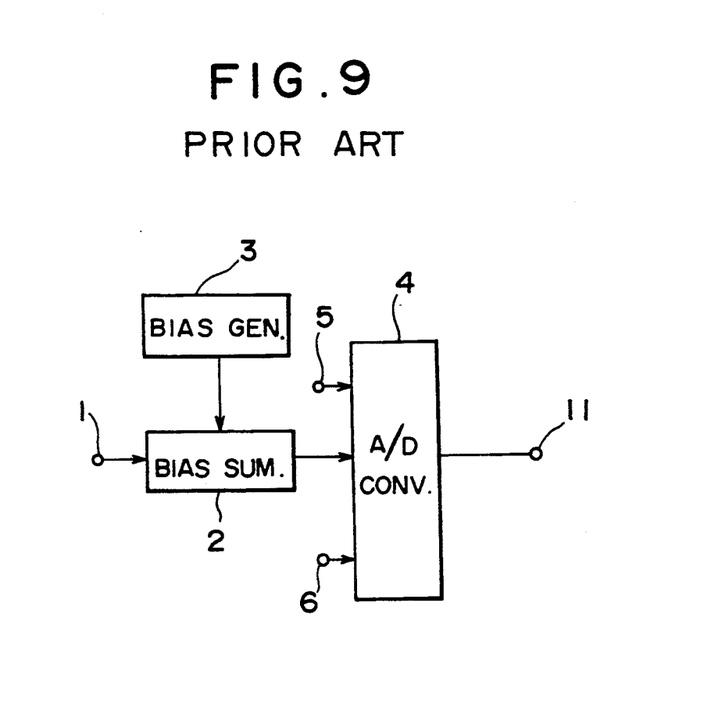
FIG. 9 is a block diagram of a conventional A/D converter circuit.

A conventional A/D converter circuit for efficiently performing analog to digital conversion by biasing the input signal level by a predetermined level is constructed as illustrated in FIG. 9. That is, the analog signal applied to an analog signal input terminal 1 is first applied to a bias voltage summing circuit 2 in which a bias voltage from a bias voltage generation circuit 3 is summed with the analog signal before being applied to the A/D converter circuit 4. The A/D converter circuit 47 is provided with a high potential reference voltage input terminal 5 and a low potential reference voltage input terminal 6 for quantizing the analog signal in the voltage range from the low potential reference voltage to the high potential reference voltage. If the number of quantization bits is, for example, 8 bits, the output from the A/D converter circuit will be OOH when the input is equal to the low potential reference voltage. On the other hand, the output will be FFH when the input is equal to the high potential reference voltage.

The A/D converter 4 may be operated with a single or a dual voltage source. The following conditions must be met between the reference voltage and the power supply voltages:

voltage of the negative voltage source $\leq$ low potential reference voltage $\leq$ high potential reference voltage $\leq$ voltage of the high potential source.

Accordingly, if the A/D converter is driven by, for example, a single voltage source of +5 volt, the minimum voltage of the analog input signal must be 0 (=negative power source voltage=low potential reference voltage). On a case of an input analog signal changing to positive and negative voltages around the 0 center voltage, a bias voltage is added by the bias voltage summing circuit 2 to shift the input signal voltage varying from 0 volt to the high potential reference voltage before analog to digital conversion. In this case, summed with the input analog signal is one-half of the high potential reference voltage as the bias voltage, thereby outputting 80 H from the A/D converter when 0 volt input is applied to the bias voltage summing circuit.

In the conventional A/D converter circuit described above has a problem to cause offset in the output of the A/D converter. For example, a voltage divider circuit to divide the reference voltage may be used for obtaining the bias voltage. However, it is difficult to obtain a desired resistance ratio because of tolerance of resistors. Setting a desired resistance ratio using a variable resistor or a potentiometer is not stable enough due to aging, temperature variation, etc. Accordingly, the bias voltage may be subjected to considerable changes due to aging, temperature variation, accuracy of parts, etc. Also, there may cause offset in the analog signal before summing with the bias voltage due to the electric characteristic of the amplifier for amplifying the analog signal.

SUMMARY OF THE INVENTION

It is therefore an object of the present invention to solve the above problem and to provide an A/D converter circuit capable of removing the offset in the output from the A/D converter circuit.

In the present invention, any offset from the ideal value of the average voltage in the input signal to the A/D converter circuit is detected by an offset detection circuit. In a first embodiment of the invention, the detected offset is subtracted from the digital output data from the A/D converter to compensate the digital output data by removing the offset in the analog signal and the bias voltage from the output data from the A/D converter. Alternatively, the bias voltage is modified by the detected offset detection circuit in such a manner that the average voltage in the input signal to the A/D converter is equal to the ideal voltage, thereby not causing any offset in the output from the A/D converter. Here, the modification in the bias voltage means that the bias voltage is made to be equal to the ideal bias voltage and that the offset voltage in the analog signal is canceled.

Other objects and features will be clarified from the following description with reference to the attached drawings.

DESCRIPTION OF THE PREFERRED EMBODIMENTS

Preferred embodiments of the present invention will be described hereunder by reference to the accompanying drawings.

Figure 1:
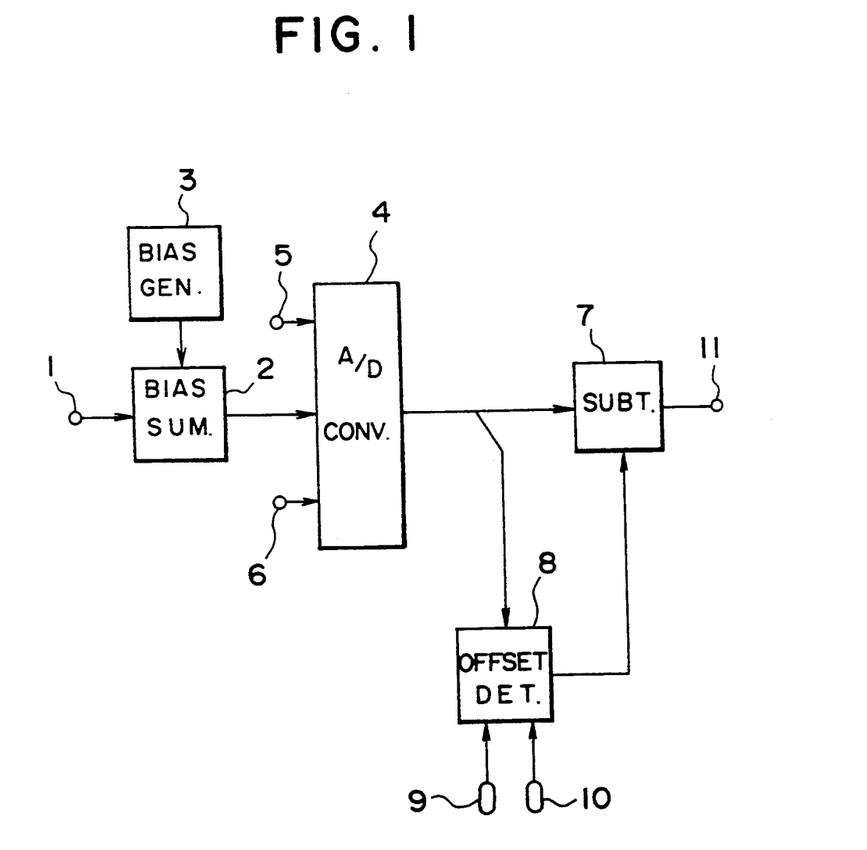
FIG. 1 is a block diagram of one embodiment of the A/D converter circuit according to the present invention.

Illustrated in FIG. 1 is a block diagram of a first embodiment of the A/D converter circuit according to the present invention in which like reference numerals are used to represent similar elements to those in FIG. 9. A first embodiment features the addition of a subtractor 7 and an offset detection circuit 8.

The analog signal to be applied to an input analog signal input terminal 1 has a known average voltage but is offset as described above. Samples of the input signal will be equally distributed on both sides of the average voltage in case of Gaussian distribution or uniform distribution. Examples of such input signals are sinusoidal waveform signals and eye pattern signals obtained by orthogonal demodulation of MSK or QPSK modulation signals. An example of asymmetrical distribution is a signal due to the electric field fluctuation under, for example, Rayleigh fading. Also, an error is contained in the bias voltage generated by a bias voltage generator circuit 3. Accordingly, the actual average voltage $V_{AD}$ of the input signal to an A/D converter 4 is represented as follows:

$$V_{AD} = V_{AV} + \Delta V + V_B + \Delta V_B \quad (1)$$

The ideal average voltage $V_{AD}'$ is represented as follows:

$$V_{AD}' = V_{AV} + V_B \quad (2)$$

where.

$V_{AV}$: ideal average voltage of the analog signal
$\Delta V$: offset voltage of the analog signal
$V_B$: ideal value of the bias voltage
$\Delta V_B$: error of the bias voltage from the ideal value As a result, it is understood that an offset is caused in the output data from the A/D converter 4. The first embodiment is constructed to compensate for the offset in the output data from the A/D converter 4 as described hereunder.

An offset detection circuit 8 has two terminals 9 and 10 for externally receiving the ideal value of the bias voltage and the ideal average voltage of the analog signal, respectively. Firstly, output samples from the A/D converter 4 are used to obtain the average voltage of the analog signal which is given by the above expression (1). Then, the offset $(\Delta V + \Delta V_B)$ is detected through mathematical operation by subtracting the ideal average of the analog signal to be applied to the ideal average voltage input terminal 10 and the ideal bias voltage to be applied to the bias voltage input terminal 9 from the obtained average voltage, i.e., subtracting the above expression (2) from the expression (1).

A subtractor 7 subtracts the output data of the offset detection circuit 8 from the output data of the A/D converter 4. This results in providing from a digital data output terminal 11 a correct digital output data in which the offset $\Delta V$ in the analog signal and the offset $\Delta V_B$ in the bias voltage are removed.

Now, the present invention will be described more in detail by reference to FIG. 2.

Figure 2:
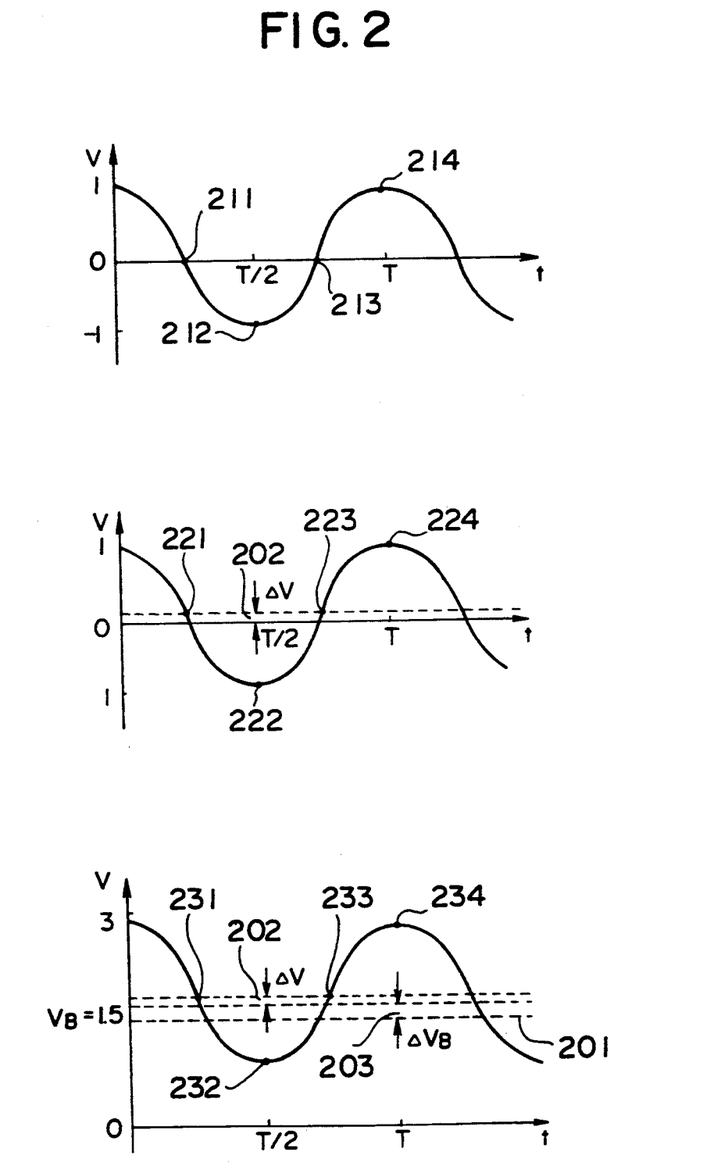
FIG. 2 is a drawing to explain how the offset detection circuit in FIG. 1 operates.

Illustrated in FIG. 2 is an example of sampling a sinusoidal signal expressed by $\cos(2\pi ft)$ [V] with $V_B = 1.5$ [V](201), $\Delta V = 0.1$ [V] (202), and $\Delta V_B = 0.2$ [V] (203) at the frequency 4f [Hz]. Illustrated in FIG. 2(a) is an original waveform of the analog signal free from any offset. The voltage samples at t=T/4, 2T/4, 3T/4 and T are 0 V (211), −1 V (212), 0 V (213) and 1 V (214), respectively.

Illustrated in FIG. 2(b) is an input signal waveform of a bias voltage summing circuit 2 which is equal to the analog signal waveform in FIG. 2(a) with the offset voltage $\Delta V = 0.1$ [V] (202). Accordingly, the voltage samples at t=T/4, 2T/4, 3T/4, and T are 0.1 V (221), −0.9 V (222), 0.1 V (223), and 1.1 V (224), respectively.

Now, illustrated in FIG. 2(c) is an input signal waveform to the A/D converter 4 added with the bias voltage $V_B + \Delta V_B = 1.5 + 0.2$ [V]. Obtained voltage samples at t=T/4, 2T/4, 3T/4, and T are 1.8 V (231), 0.8 V (232), 1.8 V (233), and 2.8 V (234), respectively.

The offset detection circuit 8 detects the average value 1.8 V of the four samples 1.8 V (231), 0.8 V (232), 1.8 V (233) and 2.8 V (234). By subtracting the known ideal average voltage 0 V of the analog signal and ideal value of the bias voltage 1.5 V, the offset ($\Delta V + \Delta V_b = 0.3$ V) can be obtained. In the above example, four samples are used to determine the average voltage of the analog signal. However, it is generally necessary to use a large number of samples to obtain average voltage of the analog signal.

Figure 3:
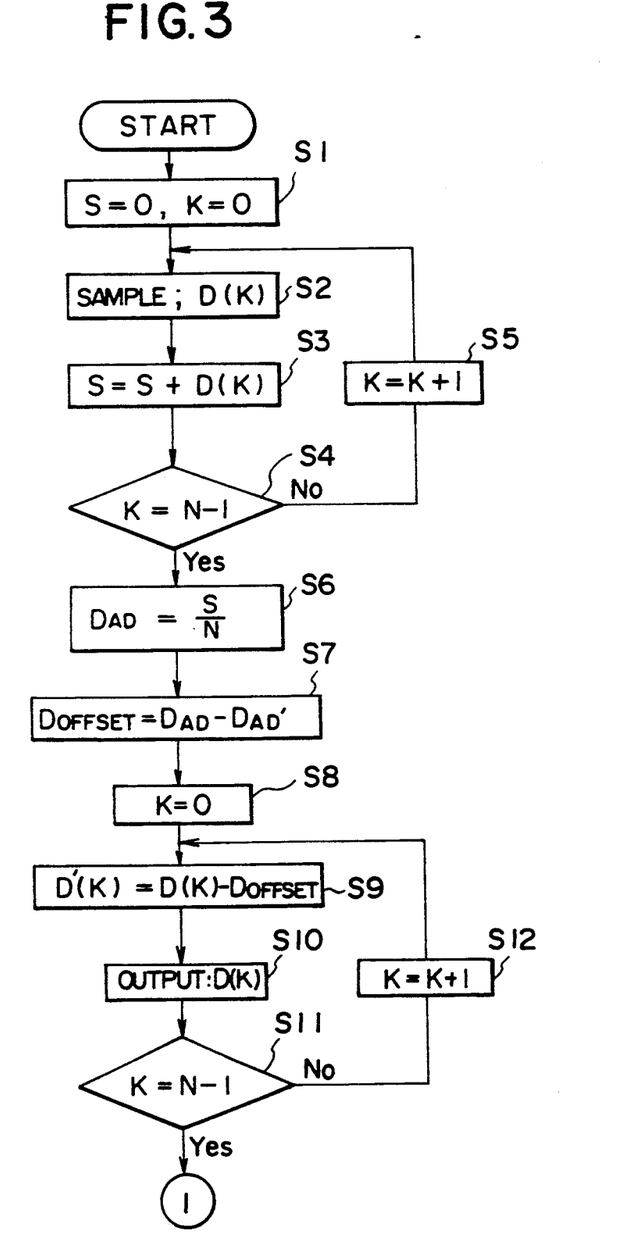
FIG. 3 is a flowchart to explain the operational step of the offset detection circuit 8 and the subtractor 7 in FIG. 1.

The offset detection circuit 8 and the substractor 7 are constructed by a processing circuit to perform the series of processing the sample data from the A/D converter 4 as illustrated in FIG. 3.

In FIG. 3, it is assumed that S is equal to the accumulation of first to K-th sample D(k). In step S1, S and K are initialized, i.e., S=0 and K=0. Then, a K-th sample D(k) is obtained (in step S2) and an accumlation S=S+D(k) is obtained (in step S3) subsequently, a judgement is made if the number of sample reaches the predetermined number (N−1) (in step S4). If not reached (N−1), K is incremented by 1 (in step S5) to repeat the step S2 and subsequent processings on the next sample.

When K=N−1 is detected in the step S4, the accumulated value S is divided by the number of accumulated samples N to obtain the average value $D_{AD}$ (in step S6). An offset voltage $D_{OFFSET}$ is obtained (or assumed) by subtracting the sum $D'_{AD}$ of the ideal average voltage of the input analog signal and the ideal bias voltage respectively applied to the terminals 9 and 10 from the average value $D_{AD}$ (in step S7).

The true offset voltage is obtained in this manner to correct the output digital data from the A/D converter 4 using the offset voltage $D_{OFFSET}$. That is, in order to correct the sample data used for calculating the above offset voltage, these sample data are temporarily stored in a memory and subtraction processing of the offet voltage $D_{OFFSET}$ is carried out for the K=0 sample value D(0) to the (N−1)−th sample value D(N−1). In step S8, K is initialized (K=0) and subsequently a corrected data D'(k) is obtained by subtracting $D_{OFFSET}$ from the sample value D(k) (in step S9). The corrected data D'(k) is derived from an output terminal 11 (in step S10). A judgement is made if K reached N−1 (in step S11). K is incremented by 1 if (N−1) is not reached yet (in step S12) to return to step S9. On completing the processing in step S11, the correction of the above N samples is finished. The correction of the subsequent (N+1)−th the sample is carried out in the same manner as the steps S9 and S10. Processing procedures for unlimited number of subsequent correction samples are illustrated in FIG. 4.

Figure 4:
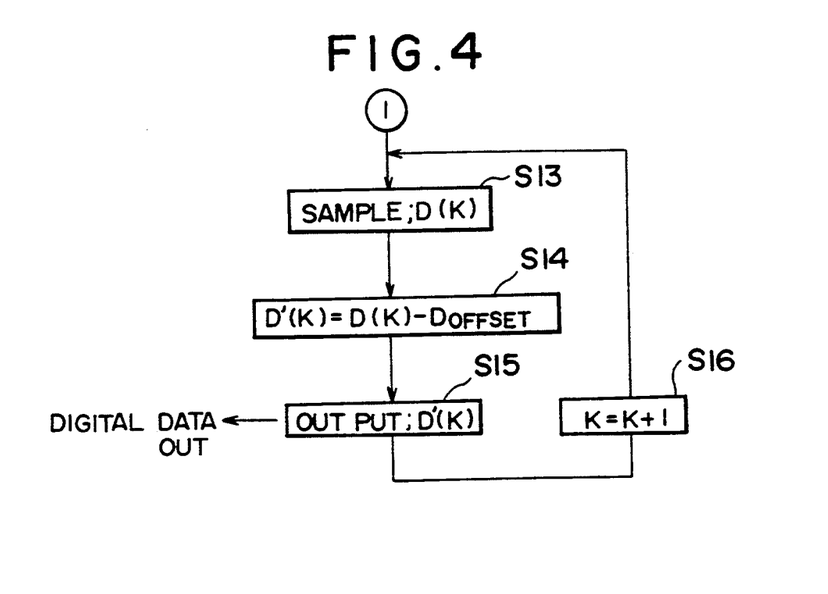
FIG. 4 is a flowchart to show the operational steps of the offset detection circuit 8 and the substractor 7 in FIG. 1 for correcting unlimited number of input samples subsequent to the sample used for determining the offset voltage.

In FIG. 4, sample value D(k) is obtained (in step S13), the corrected data D'(k) is obtained by subtracting the offset voltage $D_{OFFSET}$ from the above D(k) (in step S14), and the corrected data D'(k) is derived from the output terminal 11 (in step S15). Subsequently, K is incremented by 1 (in step S16) to perform the similar processing on the subsequent samples by returning to step S13.

Figure 5:
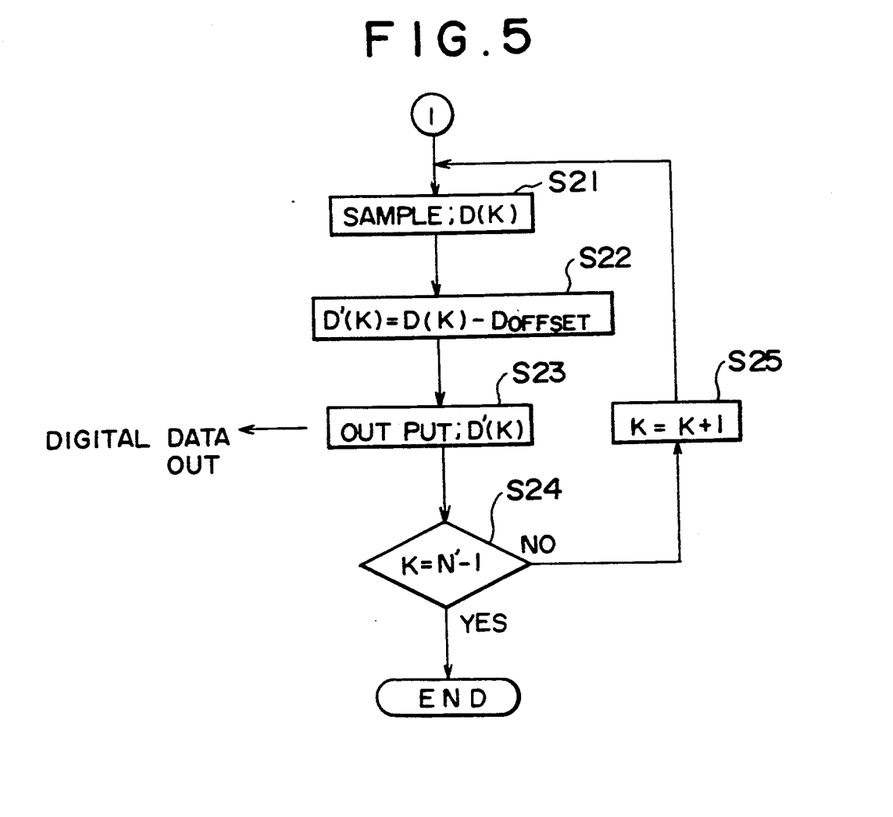
FIG. 5 is a flowchart to show the operational steps of the offset detection circuit 8 and the subtractor 7 for correcting only predetermined number N' of input samples subsequent to the sample used for determining the offset voltage.

On the other hand, illustrated in FIG. 5 is an example of performing correction only on predetermined number (N') of samples D(N+1), D(N+2), . . ., D(N+N') after completing the processing step S11 in FIG. 3.

The sample D(k) is obtained in step 21 and the corrected data D'(k) is obtained by subtracting the offset voltage $D_{OFFSET}$ from the above D(k) (in step 22). After supplying the D'(k) to the output terminal 11, a judgement is made if K reaches (N'−1) (in step S24). If (N'−1) is not reached, K is incremented by 1 (in step S25) to return step S21. Processing is terminated if K reaches (N'−1). It is the matter of course that the offset detection using the sample value obtained from the A/D converter 4 and the correction of the output data from the A/D converter can be made after temporarily storing the data in a memory or the like.

Figure 6:
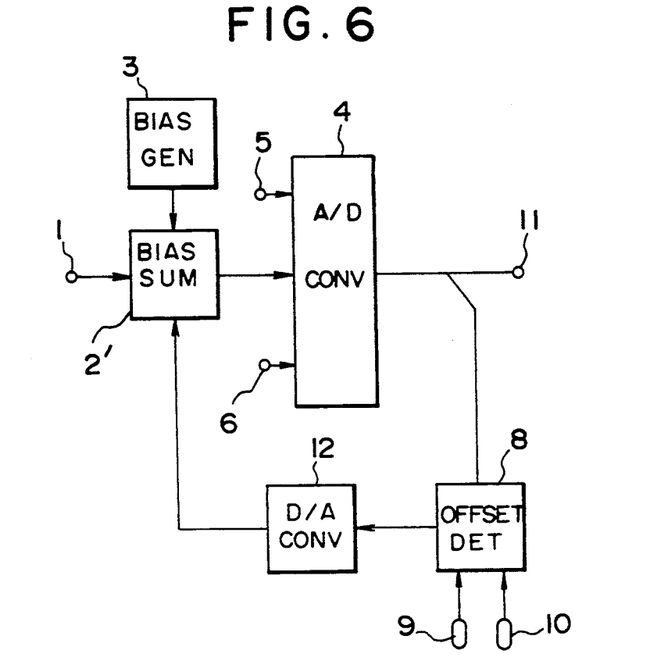
FIG. 6 is a block diagram of another embodiment of the A/D converter circuit according to the present invention.

Now, illustrated in FIG. 6 is the A/D converter circuit according to a second embodiment of the present invention. The second embodiment eliminates the subtractor 7 in the first embodiment. The digital output ($D_{OFFSET}$) from the offset detection circuit 8 is converted into an analog signal by a D/A (digital-to-analog) converter 12 and is applied to a bias voltage summing circuit 2' so that the average voltage of the input signal to the A/D converter 4 is equal to the voltage as given by the above expression (2).

Figure 7:
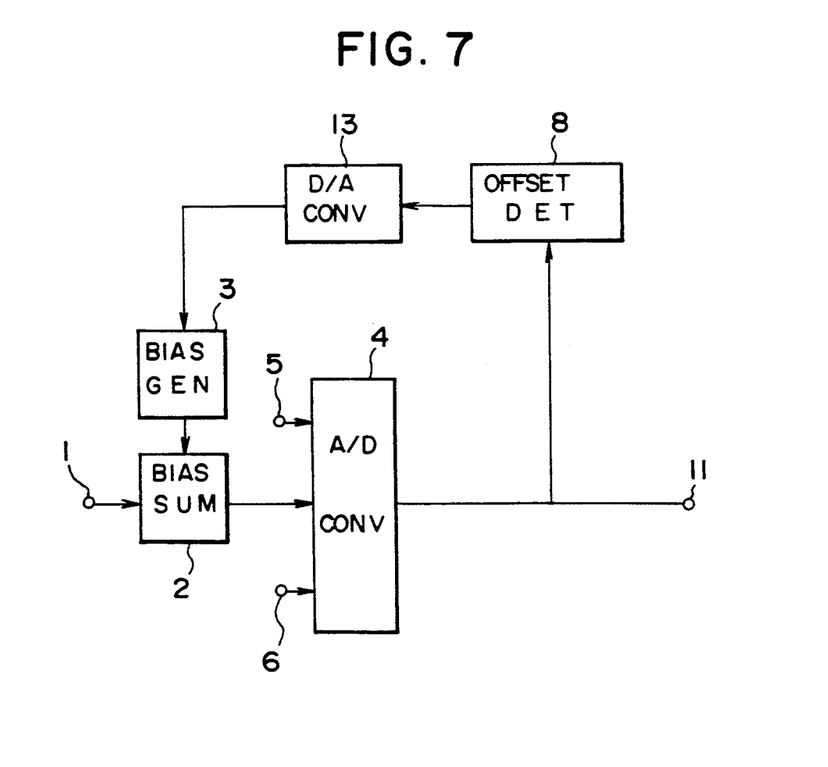
FIG. 7 is a block diagram of yet another embodiment of the A/D converter circuit according to the present invention.

In other words, the bias voltage summing circuit 2' is provided with means to correct the input analog signal to cancel the offset voltage so that the input bias voltage is equal to the ideal bias voltage. As a result, an offset free correct digital data is derived from the A/D converter 4. It is to be noted, here, that the offset voltage $D_{OFFSET}$ derived fro the offset detection circuit 8 is converted into an analog signal by a D/A converter 13 before being applied to the bias voltage generation circuit 3 for previously correcting the bias voltage by the bias voltage generation circuit 3 as illustrated in FIG. 7. In this case, it is of course true that the processing steps S1 through S6 in FIG. 3 are used to determine the offset voltage $D_{OFFSET}$.

Figure 8:
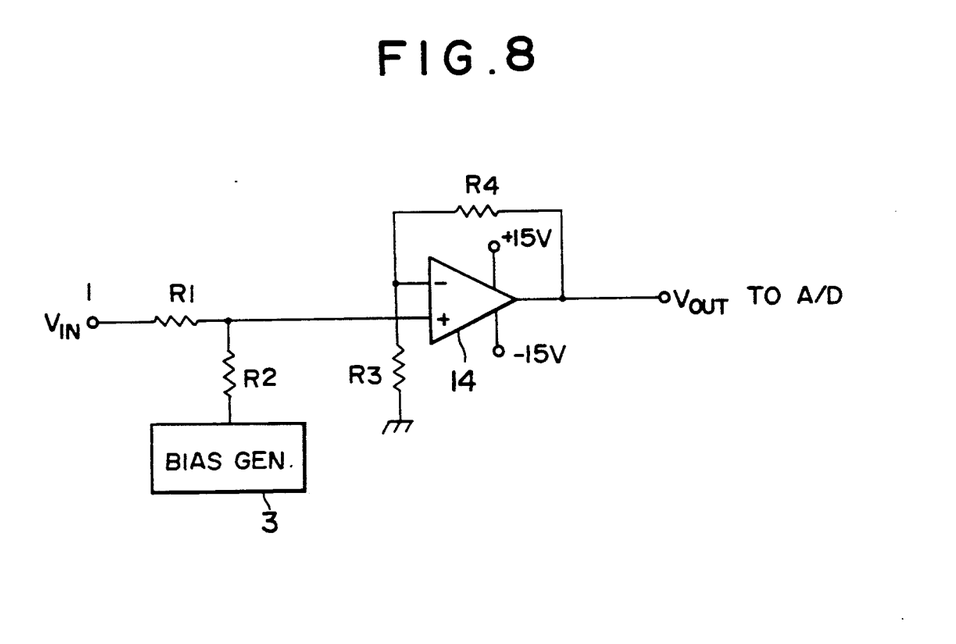
FIG. 8 is a block diagram of the bias voltage summing circuit in FIG. 1.

The bias voltage summing circuit 2 may be implemented, for example, by using an operational amplifier 14 as illustrated in FIG. 8. The analog signal to the input terminal 1 in FIG. 8 is applied to the non-inverting input terminal of the operational amplifier 14 by way of a resistor R1. The bias voltage from the bias voltage generation circuit 3 is summed by way of a resistor R2. The inverting input of the operational amplifier 14 is returned to ground by way of a resistor R3 and is connected to the output terminal by way of a feedback resistor R4. Two voltage sources +15 V and −15 V are used for operating the operational amplifier 14.

As described above, the A/D converter circuit according to the first embodiment of the invention corrects the output data from the A/D converter for converting the analog signal in the range from the low to the high potential reference voltages into a corresponding digital data by detecting the offset from the ideal value for the bias voltage to be added to the input signal to the A/D converter and the offset from the ideal value of the average voltage in the analog signal. In the A/D converter circuit according to the second embodiment of the invention, an offset from the ideal value of the bias voltage to be added to the input signal to the A/D converter for converting the analog signal in the range from the low to the high potential reference voltages into the corresponding digital data and also the offset from the ideal value of the average voltage in the analog signal are detected to correct the bias voltage so that the average voltage of the input signal to the A/D converter is equal to the ideal value. As a result, the correct digital data will be effectively obtained.

WHAT IS CLAIMED IS:

1. An A/D converter circuit comprising:
bias voltage summing means for adding a bias voltage to an analog signal;
A/D converter means for digitizing the output analog signal from said bias voltage summing means in the range between the low and high reference voltages;
offset detection means for detecting the offset by subtracting the ideal average voltage of the analog signal and the ideal value of the bias voltage from the average value of output samples from said A/D converter means; and
subtraction means for deriving the output by subtracting the output data of said offset detection circuit from the output data of said A/D converter means.

2. An A/D converter circuit comprising:
bias voltage summing means for adding a bias voltage to an analog signal;
bias voltage generation means for generating the bias voltage;
A/D converter means for digitizing the output analog signal from said bias voltage summing means in the range between low and high reference voltages;
offset detection means for detecting offset by subtracting the ideal average voltage of the analog signal and the ideal value of the bias voltage from the average value of the output samples from said A/D converter means; and
correction means for supplying the output of said offset detection means to either one of said bias voltage generation circuit or said bias voltage summing circuit to correct the bias voltage so that the average voltage of the input signal to said A/D converter means is equal to the ideal value.

3. An A/D converter circuit comprising:
bias voltage summing means for adding a bias voltage to an analog signal;
A/D converter means for digitizing the output analog signal from said bias voltage summing means in the range between low and high reference voltage;
means for outputting the accumulated value of a predetermined number (N) of samples;
means for obtaining the average value by dividing the accumulated value by N;
means for detecting the offset voltage value by subtracting the ideal average voltage value of the analog signal and the ideal value of the bias voltage from the average value; and
subtraction means for outputting the subtraction of the output data of said offset detection circuit from the output data of said A/D converter means.

4. The A/D converter circuit of claim 3 wherein the correction is made by subtraction operation using continuous offset voltage values of the samples subsequent to the predetermined number (N).

5. The A/D converter circuit of claim 3 wherein the correction is made by subtraction operation using offset voltage value of a predetermined number of samples subsequent to the predetermined number (N).

6. An A/D converter circuit comprising:
bias voltage summing means for adding a bias voltage to an analog signal;
bias voltage generation means for generating the bias voltage;

A/D converter means for digitizing the output analog signal from said bias voltage summing means in the range between low and high reference voltages;

means for outputting the accumulated value of a predetermined number (N) of samples;

means for obtaining the average value by dividing the accumulated value by N;

means for detecting the offset voltage value by subtracting the ideal average voltage value of the analog signal and the ideal value of the bias voltage from the average value; and correction means for supplying the output of said offset detection means to either one of said bias voltage generation circuit or said bias voltage summing circuit to correct the bias voltage so that the average voltage of the input signal to said A/D converter means is equal to the ideal value.

7. An A/D converter circuit comprising:

bias voltage summing means for adding a bias voltage to an analog signal;

bias voltage generation means for generating the bias voltage;

A/D converter means for digitizing the output analog signal from said bias voltage summing means in the range between low and high reference voltages;

means for outputting the accumulated value of a predetermined number (N) of samples;

means for obtaining the average value by dividing the accumulated value by N;

means for detecting the offset voltage value by subtracting the ideal average voltage value of the analog signal and the ideal value of the bias voltage from the average value;

D/A converting means for converting the obtained offset voltage into an analogue signal and supplying the converted signal to one of said bias voltage generating circuit and said bias voltage adding circuit; and means, in response to the output of said D/A converting means, for compensating the bias voltage of one of said bias voltage generating circuit and said bias voltage adding circuit.

8. An A/D converting method comprising the steps of:

adding a bias voltage to an analog signal;

digitizing the added analog signal in the range between the low and high reference voltages;

detecting an offset by subtracting the ideal average voltage of the analog signal and the ideal value of the bias voltage from the average value of said digitized data; and deriving the output by subtracting said detected offset from said digitized data.

* * * * *